United States Patent
Rodriguez et al.

(10) Patent No.: US 6,582,977 B1
(45) Date of Patent: Jun. 24, 2003

(54) METHODS FOR DETERMINING CHARGING IN SEMICONDUCTOR PROCESSING

(75) Inventors: John Rodriguez, Richardson, TX (US); Anand Krishnan, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/230,703

(22) Filed: Aug. 29, 2002

(51) Int. Cl.[7] ............................................... G01R 31/26
(52) U.S. Cl. ................................................ 438/14; 438/3
(58) Field of Search ..................................... 438/3, 14

(56) References Cited

U.S. PATENT DOCUMENTS

| | | |
|---|---|---|
| 5,315,145 A | 5/1994 | Lukaszek |
| 5,781,445 A | 7/1998 | Shiue et al. |
| 5,869,877 A | 2/1999 | Patrick et al. |
| 5,959,309 A | 9/1999 | Tsui et al. |
| 5,963,412 A | 10/1999 | En |
| 6,081,417 A * | 6/2000 | Matsuki ...................... 361/311 |
| 6,265,729 B1 | 7/2001 | Nelson et al. |

* cited by examiner

*Primary Examiner*—Jey Tsai
(74) *Attorney, Agent, or Firm*—Jacqueline J. Garner; W. James Brady, III; Frederick J. Telecky, Jr.

(57) ABSTRACT

Methods are disclosed for determining charging related to one or more semiconductor processing steps. A wafer having a substantially unpolarized ferroelectric capacitor formed therein is exposed to a processing operation. After processing, the ferroelectric capacitor is measured to determine the extent to which the processing operation polarized the ferroelectric capacitor, and a process related charging value is determined according to the ferroelectric capacitor polarization.

30 Claims, 7 Drawing Sheets

METHODS FOR DETERMINING CHARGING IN SEMICONDUCTOR PROCESSING

FIELD OF INVENTION

The present invention relates generally to the art of semiconductor devices and more particularly to methods for determining process related charging during semiconductor processing operations.

BACKGROUND OF THE INVENTION

In the course of manufacturing semiconductor devices, certain processing steps involve the use of electrically charged plasma. Ion implantation, plasma etching, plasma enhanced deposition processes and other charged processing operations may damage semiconductor wafers, and the devices and circuits formed therein. The plasma in such processes includes charged particles, some of which may accumulate on the wafer surface through antenna charging. For example, in back-end-of-line (BEOL) interconnect processing, inter layer dielectric (ILD) material is often deposited using plasma enhanced chemical vapor deposition (PECVD) and etched using plasma based reactive ion etching (RIE).

During interconnect processing, moreover, one or more patterned metal layers are formed over and between ILD layers to electrically connect electrical devices formed on or in the substrate, such as transistors, memory cells, and the like. The electrical terminals of these devices, such as gates, and source/drain regions, are thus often electrically connected to conductive features directly exposed to these back end processes, which operate as charge gathering antennas. As a result, charge accumulating on exposed conductive features may be discharged through the electrical devices to the substrate, sometimes causing damage and/or performance degradation in the electrical devices. Of particular interest is damage or degradation of the gate oxide layer in MOS type transistors fabricated in a wafer.

Various devices have thusfar been developed to measure the resulting voltage potential (or a current flow) between a charge collection area on the surface of the semiconductor device wafer and the substrate during processing operations or steps. Such devices include monitors or sensors located proximate the wafer workpieces during process steps of interest, which provide sensor signals to control systems or user interface devices. The actual charging of the semiconductor wafer is then inferred from the sensor signal. Charge monitoring (CHARM) wafers have been extensively employed in characterizing process related charging levels, which can be inserted into a process chamber to record the charging levels encountered therein. The CHARM test wafers include a series of electrically erasable programmable read only memory (EEPROM) cell charge sensors or detectors connected between the substrate and conductive antenna pads on the CHARM wafer surface. After the process, the status or data of the various EEPROM sensors is measured, and the results are evaluated using commercially available software tools.

Other process charging measurement devices have been developed, which are formed directly in the wafer workpieces or in dedicated test wafers. These in-situ process charging sensors typically consist of dedicated memory cells, such as one or more EEPROM cells formed in the production wafer. For example, one or more such EEPROM memory cells having a stacked gate MOS type transistor operating as voltage or current sensor may be formed in the production wafers, typically during back end interconnect processing. The memory cell type sensor devices are typically fabricated in peripheral areas of the wafer, such as in scribe regions between device dies on a wafer. The status of these in-situ memory cell sensors can then be interrogated before and after a process of interest to ascertain whether process related charging exceeded a threshold value associated with the cell. In this approach, a charge collection electrode is formed on the top of the wafer, and is connected to the control gate of a stacked gate MOS type transistor (EEPROM cell) to collect process related charge during processing, which in turn affects the transistor gate.

As process charge is collected at the wafer surface, the transistor based memory cell measures the resulting voltage potential between the charge collection electrode and the wafer substrate. The voltage potential in the wafer, in turn changes the threshold voltage Vt of the memory cell, and hence the threshold voltage Vt thereof can be measured before and after a plasma related processing step. A comparison of the threshold voltage measurements is then used to estimate the process charging associated with the processing step. A first or initial threshold voltage is programmed prior to exposing the wafer to a plasma related process, typically by probing the wafer and providing a known programming signal to the transistor via the charge collection electrode. At this point, the actual initial threshold voltage is sometimes measured or verified, prior to performing wafer processing steps involving potential wafer charging.

After the processing step or steps of interest, the EEPROM transistor is probed and a second or final threshold voltage is measured. Once the initial and final threshold voltages are determined, the surface potential related to the process can be estimated using a calibration curve or plot of threshold voltage shift versus gate voltage for the EEPROM transistor. In this regard, the estimated gate voltage represents the voltage potential between the charge collection electrode at the wafer surface and the wafer substrate. Where a resistance of known value is provided between the charge collection electrode and the substrate, then the process related current can be determined according to the gate voltage and the known resistance value. In this fashion, EEPROM transistor-based charge detection devices can be used to estimate the charging associated with a particular processing step.

However, EEPROM memory cell type charging sensors, including CHARM test wafers and in-situ EEPROM memory cell sensors suffer from limits in the range of detectable voltages. Such devices, for example, are generally limited to detection of process charging voltages between about −25 and +30 volts. Consequently, these EEPROM type monitor devices are unable to quantify or measure process related potentials above this range. Furthermore, the estimation of charging voltage values typically does not correlate to potential gate oxide damage or degradation in production wafers. In this regard, CHARM wafers in particular, are typically not manufactured according to a particular process flow of interest to a semiconductor manufacturer. Thus, the results obtained therefrom may not indicate potential problems in actual production wafers, or may provide false indications where gate oxide layers and other features of production devices may be unharmed by a process step or steps. Moreover, CHARM type test wafers are not suitable for all process operations. For example, these cannot be used to ascertain charging in deposition processes.

In addition, the threshold voltage of the EEPROM cell type detectors is sensitive to ultra-violet (UV) radiation. As a result, the threshold voltage shift represents both process related charging and exposure of the wafer to UV sources during processing. Thus, it may be difficult or impossible to differentiate between the two in order to accurately quantify the charging in the manufacturing process. The fabrication of in-situ EEPROM memory cell sensors, moreover, is relatively complex, requiring the formation in the wafer of the source, drain, and gate structures of the MOS type transistor, thereby making the manufacturing process more difficult. Furthermore, the above conventional test devices and techniques require multiple steps to pre-program and verify the EEPROM based test devices to a known initial threshold voltage before processing, and to measure the resulting threshold voltage after processing. Thus, there is a need for improved techniques by which the adverse effects of process related charging can be determined or monitored, without the UV sensitivity and voltage range limitations associated with prior in-situ and other charging sensors, and without unduly adding extra production steps to the manufacturing process flow.

SUMMARY OF THE INVENTION

The following presents a simplified summary in order to provide a basic understanding of some aspects of the invention. This summary is not an extensive overview of the invention, and is intended neither to identify key or critical elements of the invention, nor to delineate the scope of the invention. Rather, the primary purpose of the summary is to present some concepts of the invention in a simplified form as a prelude to the more detailed description that is presented later.

One aspect of the invention relates to methods for monitoring or determining process related charging in a semiconductor wafer, by which the above mentioned and other shortcomings associated with the prior art may be mitigated or avoided. Ferroelectric (FE) capacitor process charging monitor devices are employed either in-situ in a production wafer or in a dedicated test wafer, which are connected between the wafer substrate and an antenna or other conductive structure exposed to a wafer processing operation of interest. These devices are relatively simple to design and fabricate in production and/or test wafers, and do not suffer from the UV sensitivity problems associated with EEPROM type in-situ or dedicated process monitors. In addition, the FE sensor devices are not limited by the voltage detection ranges achievable in prior transistor-based memory cell charging sensors.

The FE capacitor may be formed, for example, through metal organic chemical vapor deposition (MOCVD) using ferroelectric thin films such as Pb(Zr,Ti)O3 (PZT), (Ba,Sr)TiO3 (BST), SrTiO3 (STO) and SrBi2Ta2O9 (SBT), BaTiO3 (BTO), (Bil-xLax) 4Ti3O12 (BLT), or other ferroelectric material formed between two conductive electrodes in the semiconductor wafer. Ferroelectric materials exhibit electric polarization behavior, wherein an initial polarization can be established or switched (e.g., reversed) by application of a suitable electric field, such as by applying a voltage potential between the antenna and the wafer substrate material. Once a ferroelectric capacitor device is initially polarized, the polarization typically remains until a subsequent switching voltage value of opposite polarity will cause the capacitor polarity to change. Otherwise, once the external voltage is removed, the capacitor generally retains its polarization, at least for a time.

The ferroelectric capacitor is formed in the wafer having substantially no net polarization, and is not prepolarized prior to the process of interest. Thus, the invention may be advantageously employed without significantly increasing the processing time for production wafers. One or more process operations or steps of interest are then performed on the wafer, wherein the ferroelectric device may be fully or partially polarized depending upon the charging levels experienced in the processing. The invention can be employed to quantify process related charging effects associated with any process steps or operations of interest, including deposition processes not previously measurable using conventional CHARM type wafers. For instance, the invention may be employed in determining or monitoring process charging in resist ashing operations, dielectric deposition operations, such as using plasma enhanced chemical vapor deposition (PECVD), metal or dielectric etch operations, such as dry plasma etching, implantation operations, and other process steps in which plasma is employed or other potentially damaging process related wafer charging is experienced or suspected. Further, the invention may facilitate quantification of charging levels in one or more process steps, even where the ferroelectric capacitor does not see a full saturation voltage during processing.

When the processing steps of interest are completed, the process related polarization of the ferroelectric capacitor is ascertained. Process related charging may then be determined based the amount of process related ferroelectric capacitor polarization. In one implementation, a test voltage is applied to the ferroelectric capacitor after the processing step or steps of interest, and the resulting current is measured. Based on this, a charge density is determined, such as through integration of a measured current waveform. The switching charge value for a capacitor of known area, thickness, and ferroelectric material can then be determined and correlated to a J-V (e.g., charge density versus voltage) plot for the ferroelectric capacitor. This then is indicative of a process related voltage level experienced by the ferroelectric capacitor during the processing.

In this regard, the ferroelectric capacitor dielectric material, area, and/or thickness may be selected so as to correspond to a particular gate oxide thickness of interest in the device. Thus, the invention allows quantification of charging levels or values correlated to one or more gate oxides used in transistors of the device. More than one test voltage pulse may be applied post-processing, in order to ascertain the process related polarization of the ferroelectric device. In one implementation, two test voltage pulses are applied, and a corresponding pair of current waveforms are measured. The difference between the charge densities associated with the current waveforms is correlated to a process voltage. A process related current density is determined from the process voltage using a J-V plot (e.g., current density vs. voltage) for the ferroelectric capacitor, by which a point on a process J-V curve is ascertained. From this information, a gate oxide voltage can be determined for a given gate oxide thickness in the wafer, to ascertain whether the process step or steps of interest are potentially damaging to the gate oxide of transistors in the wafer.

The invention may further be employed in association with test or production wafers having a plurality of such ferroelectric charging sensor devices, for example, where the devices have different areas or thicknesses, or were fabricated using different ferroelectric materials. In this manner, charging during processing may cause one level of polarization in some FE capacitors, and different levels of polarization in others. Knowing the device sizes and thicknesses, and the materials associated with the devices facilitates determination of the charging voltage and/or current densities during processing, and the effects thereof on different gate oxides in the wafer.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
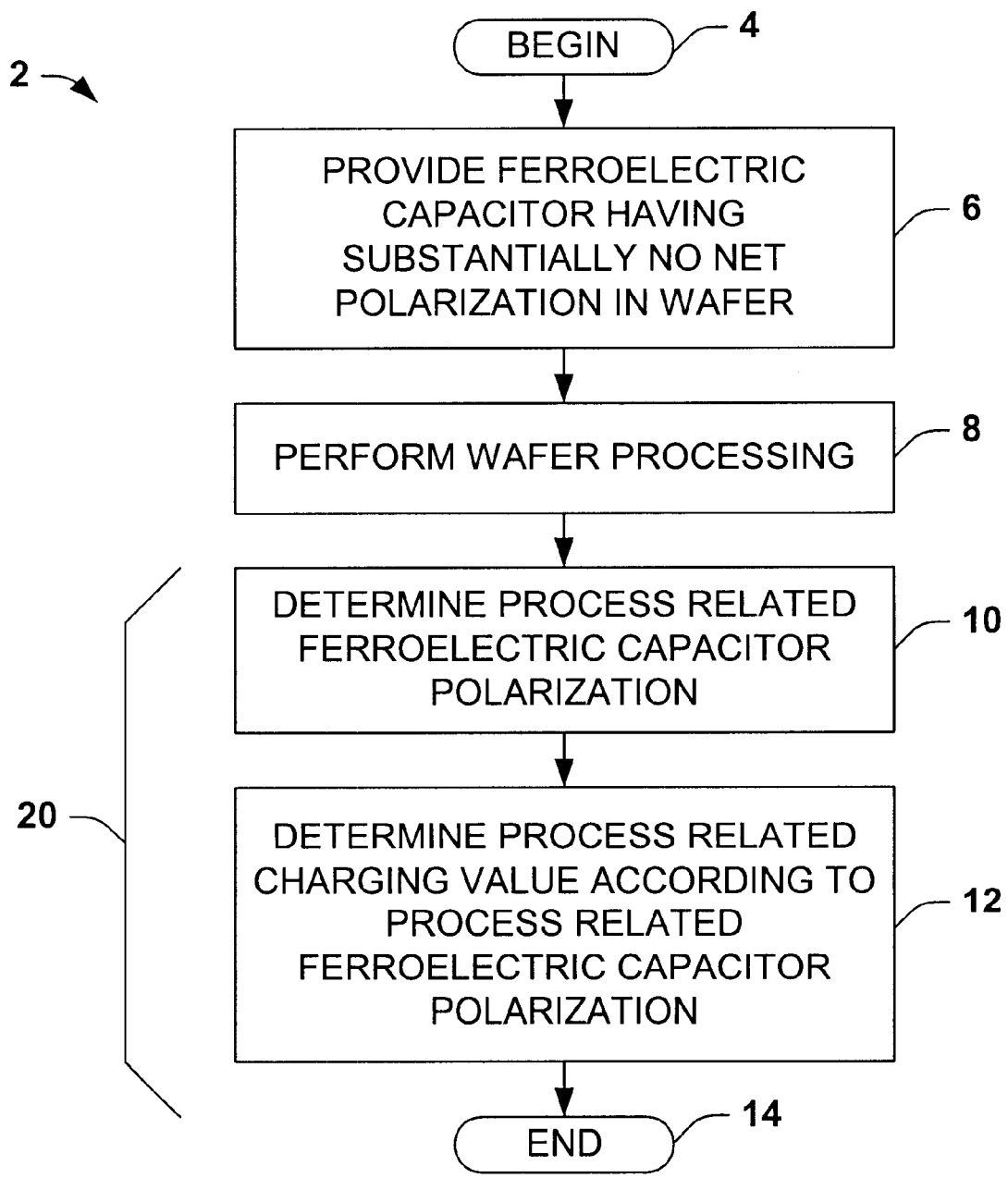
FIG. 1 is a flow diagram illustrating an exemplary method of determining process related wafer charging in accordance with the present invention.

The present invention will now be described with reference to the attached drawings, wherein like reference numerals are used to refer to like elements throughout. The invention relates to methods for determining charging related to one or more semiconductor processing steps, wherein a wafer having a substantially unpolarized ferroelectric capacitor formed therein is exposed to one or more processing operations. This information can then be used to determine whether the processing may cause damage or degradation to gate oxides in the wafer. After processing, the ferroelectric capacitor is interrogated or tested to determine the extent to which the processing polarized the ferroelectric capacitor, and from this to determine a process related charging value according to the amount of ferroelectric capacitor polarization.

Exemplary implementations of the various aspects of the invention are hereinafter illustrated and described in relation to one or more plasma related processing operations. However, it will be appreciated that the invention finds utility in association with measuring process related wafer charging in association with other processing operations, including operations not involving plasma, where charge accumulation may occur during wafer processing. In addition, one or more aspects of the invention may be implemented in structures and techniques apart from those specifically illustrated and/or described herein.

One exemplary method 2 is illustrated and described hereinafter with respect to FIG. 1 in accordance with the invention. Although the exemplary method 2 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems and structures not illustrated.

Beginning at 4, a ferroelectric capacitor device is provided in a test or production wafer at 6, wherein the ferroelectric capacitor has substantially no net polarization. Thereafter, one or more wafer processing operations are performed at 8. The processing at 8 may comprise performing one or more wafer processing steps as are known, such as an implantation operation, a resist ashing operation, a dielectric deposition operation (e.g., ILD deposition, etc.), a dielectric etch operation (e.g., contact etch, via etch, etc.), a metal etch operation, a scrubbing operation, or other operations as are known. After the processing operation at 8, the amount of ferroelectric capacitor polarization is determined at 8 and a process related charging value is determined at 12 according to the capacitor polarization, before the method 2 ends at 14. Further details of an exemplary technique 20 for determining the polarization and charging values at 10 and 12, respectively, is illustrated and described further below with respect to FIG. 2.

The ferroelectric capacitor can be provided at 6 according to any appropriate ferroelectric device fabrication processing steps as are known. For example, a ferroelectric capacitor, such as device 110 in FIGS. 3 and 4 below may be formed at 6 by forming a bottom conductive electrode over the semiconductor wafer, forming a ferroelectric material overlying the bottom electrode, and forming a top conductive electrode overlying the ferroelectric material. In addition, a conductive antenna is formed over the wafer, at least a portion thereof being exposed. This provides exposure to process operation charges and may further allow connection to external instruments, as illustrated and described with respect to FIGS. 4 and 6 below. A conductive probe pad is formed over the wafer, which is also exposed to allow connection to external instruments and is electrically connected to the bottom conductive electrode.

The invention advantageously provides a substantially unpolarized ferroelectric device at 6, without requiring a preprogram operation before the processing at 8. It will be appreciated by those of ordinary skill in the art that following deposition, a ferroelectric dielectric material exhibits a substantially zero effective or net polarization. Thus, the domains inside the deposited FE material will typically be randomly oriented, whereby the initial net polarization is small or zero. After the FE material is exposed to an external electric field of sufficient magnitude, these domains will align themselves accordingly, wherein the amount of ferroelectric capacitor polarization is related to the amount of wafer charging during processing. As a result, the FE material will then have a net polarization, which typically remains for a time after removal of the external field. At 10, the ferroelectric capacitor polarization is measured and a process related charging value, such as a voltage, current, current density, charge, or charge density value is determined at 12 according to the post-processing ferroelectric capacitor polarization.

In one example, the FE material may be employed to measure or ascertain a wafer voltage during one or more process steps of interest, by post-process determination of the extent of the device polarization. In this regard, the thickness and type of ferroelectric material, and/or the area of the ferroelectric capacitor may be adjusted in accordance with the invention, such that a current-voltage or current density-voltage relationship for the FE device closely resembles or correlates with that of a gate oxide layer formed on the wafer, as illustrated and described further below. In this manner, the voltages and currents (e.g., and/or current densities) actually seen by the gate oxide during processing may be determined using the ferroelectric capacitor type charging sensor, by which an accurate determination may be made in evaluating process -conditions during semiconductor manufacturing.

Thus, unlike conventional techniques employed in association with dedicated CHARM type test wafers, the testing of the present invention provides better correlation of test results to actual process effects on the device performance of interest, such as gate oxide voltages and currents. Moreover, the FE device testing of the invention may be used in processes involving UV exposure, whereas results from EEPROM based charge sensors is difficult or impossible to evaluate in such processes. In addition, the methods of the invention, including the exemplary method 2, are applicable to determine charging effects stemming from deposition processes as well as other processing operations. In this regard, the present invention finds utility in applications beyond those to which CHARM type techniques are applicable.

Figure 2:
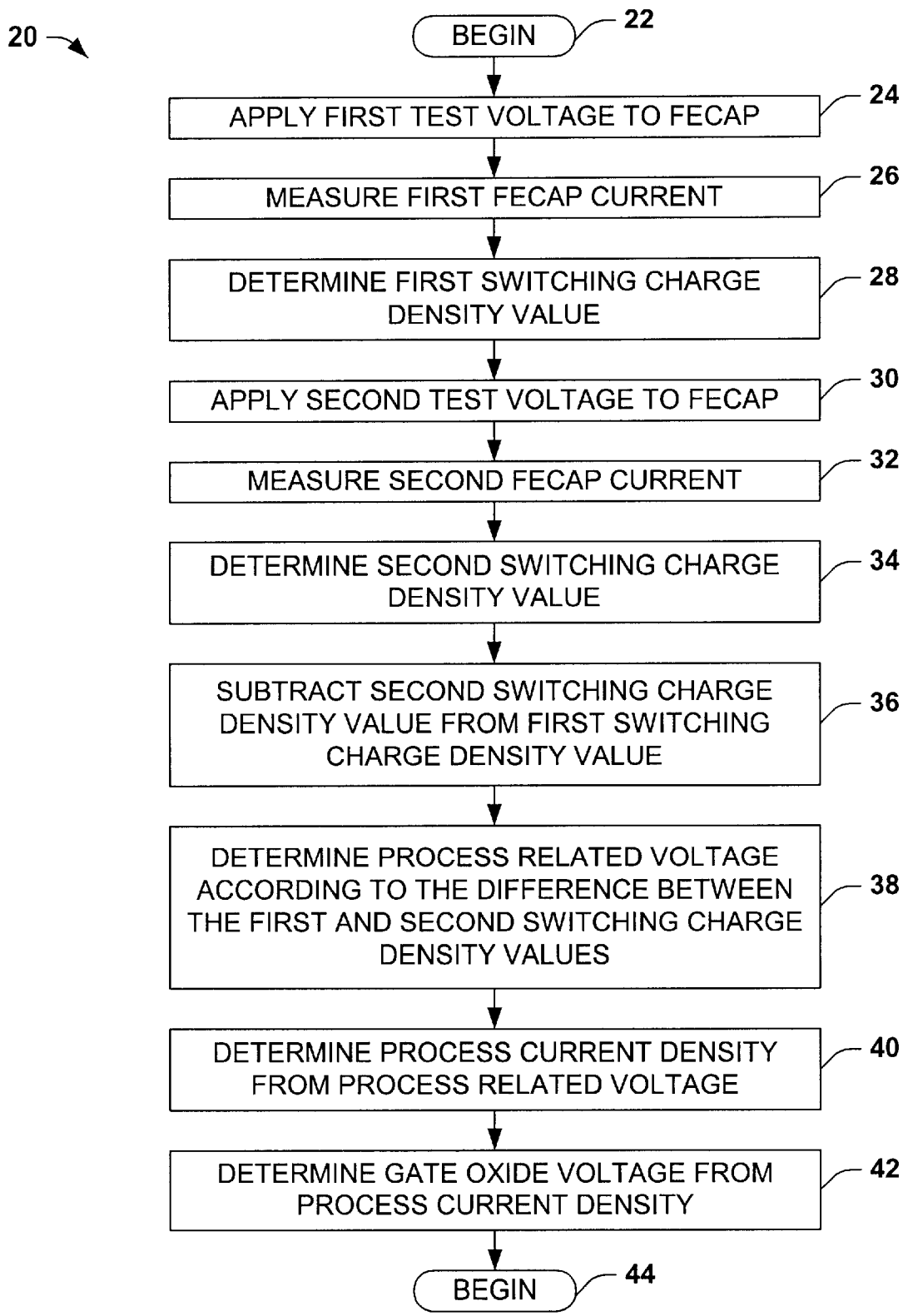
FIG. 2 is a flow diagram further illustrating a portion of the method of FIG. 1.
Figure 7A:
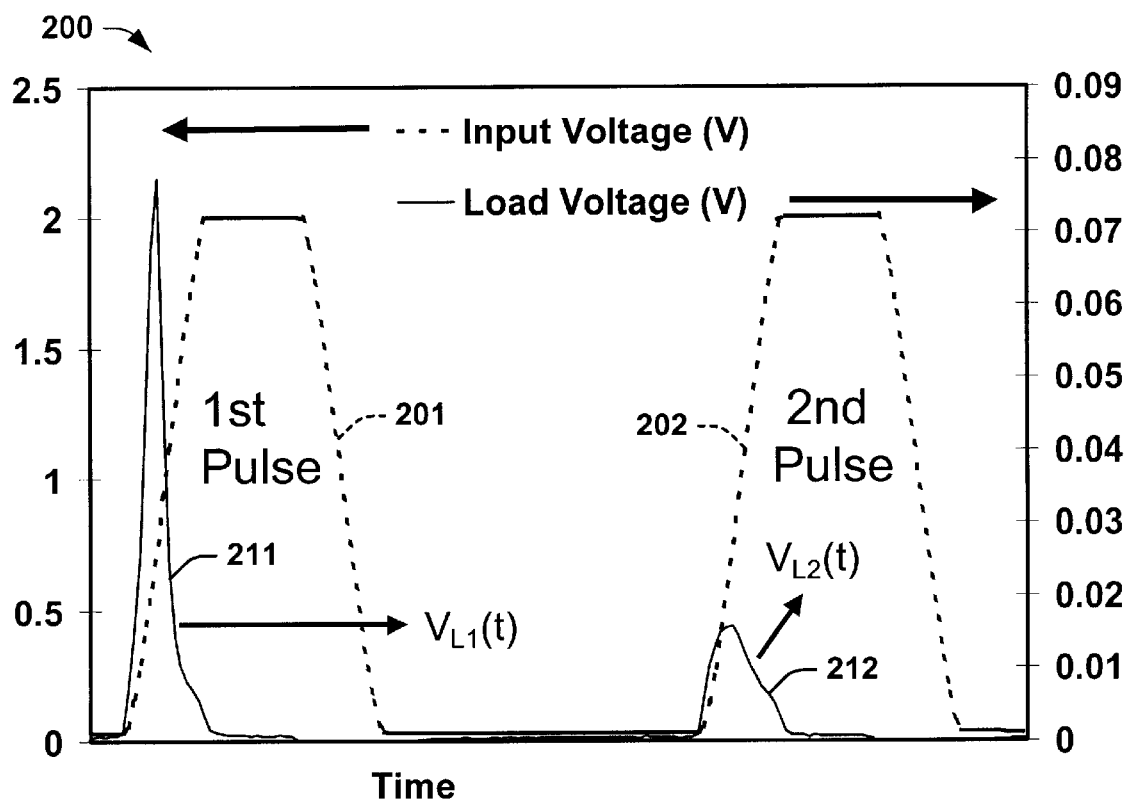
FIG. 7A is a graph illustrating exemplary first and second test voltage pulses and corresponding measured test current waveforms in one implementation of the invention.

Referring also to FIGS. 2 and 7A, a detailed process flow 20 is illustrated for one implementation of the ferroelectric capacitor polarization measurement and charging value determination of steps 10 and 12 of the method 2 in FIG. 1. Beginning at 22, the flow 20 comprises applying a first test voltage to the ferroelectric capacitor at 24 (e.g., following processing at 8 of FIG. 1) and measuring a first current associated with the ferroelectric capacitor at 26 while the first test voltage is applied, such as a current waveform.

In FIG. 7A, an exemplary first test voltage pulse 201 is illustrated in a graph 200, having a pulse width of about 10 us at a peak voltage of about 2 volts: A resulting measured current waveform 211 is measured at 26 in the flow 20, corresponding to the switching charge associated with polarization of a certain amount of the dipoles in the ferroelectric capacitor. The current measured at 26 will generally be a waveform or curve as a function of time during application of the first test voltage. In the exemplary method 20, this curve may be integrated to ascertain a value for the first switching charge density at 28. As the area (e.g., $cm^2$) of the ferroelectric capacitor is known, the switched charge may thus be determined. As the processing at 8 (FIG. 1) may have polarized the ferroelectric capacitor to a certain value, the first switching current/switching charge density values at 26 and 28 are representative of the change in polarization due to the first test voltage application at 24.

Figure 7B:
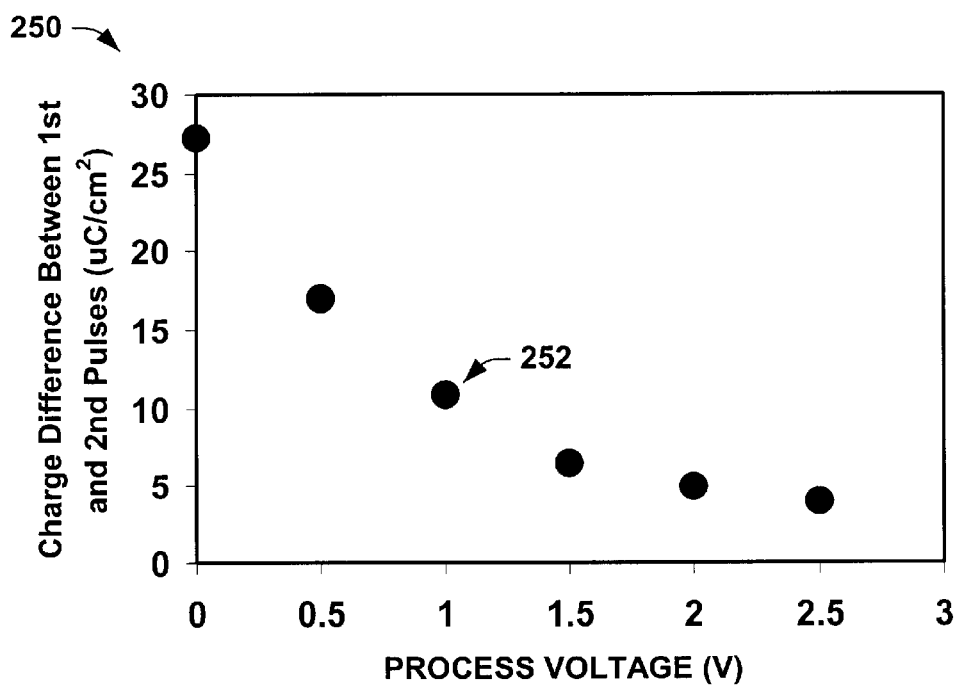
FIG. 7B is a graph illustrating a correlation between current densities for first and second test pulses and process voltage in accordance with another aspect of the invention.

At 30, a second test voltage is applied, such as the second voltage pulse 202 in FIG. 7A, which may be a short time (e.g., about 20 us) after the first pulse 201. A corresponding second current waveform 212 is measured at 32, and used at 34 to determine a second switching charge density value. At 36, the second charge density value is subtracted from the first charge density value, and the difference is used as a Y axis reference ($uC/cm^2$) in the graph 250 of FIG. 7B to obtain an X axis voltage value at 38 of the flow 20, representing the process related voltage experienced during the process step(s) of interest. Thus, for example, where the difference between the charge density values is about 11 $uC/cm^2$ at point 252 in the graph 250, the process related voltage is determined to be about 1 volt at 38.

Figure 8:
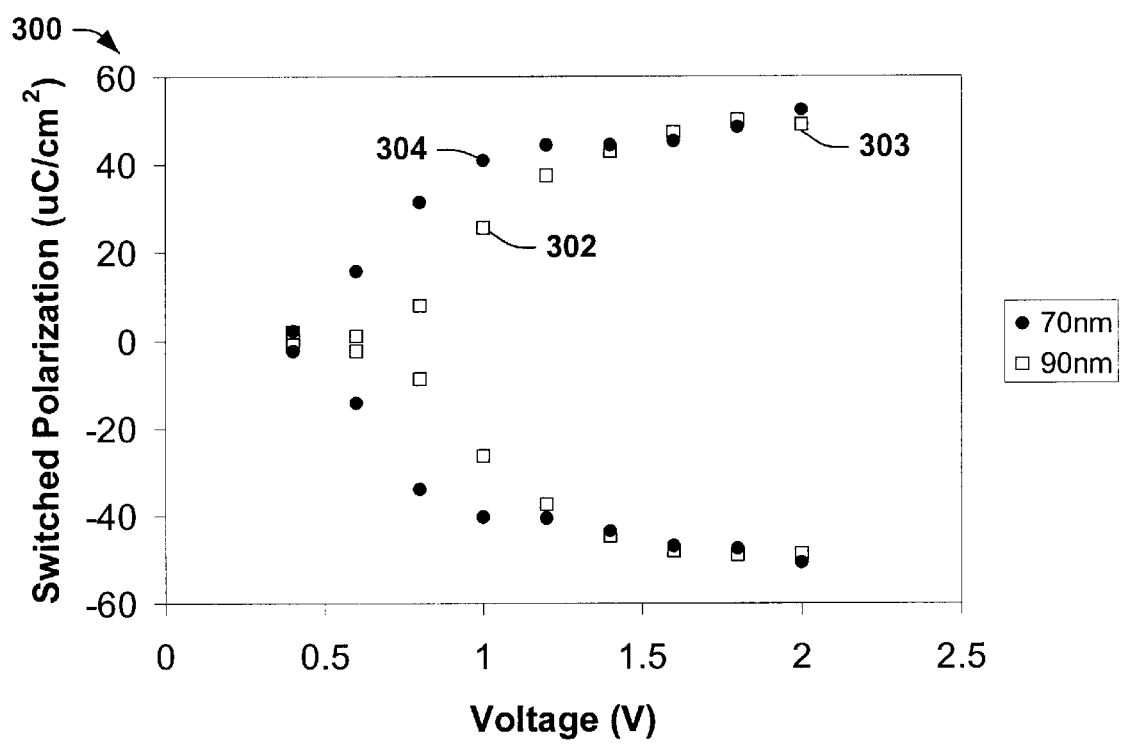
FIG. 8 is a graph illustrating switched polarization charge density versus voltage curves for ferroelectric capacitors having different thicknesses in the exemplary ferroelectric capacitor process charging monitor of FIGS. 3 and 4.
Figure 9:
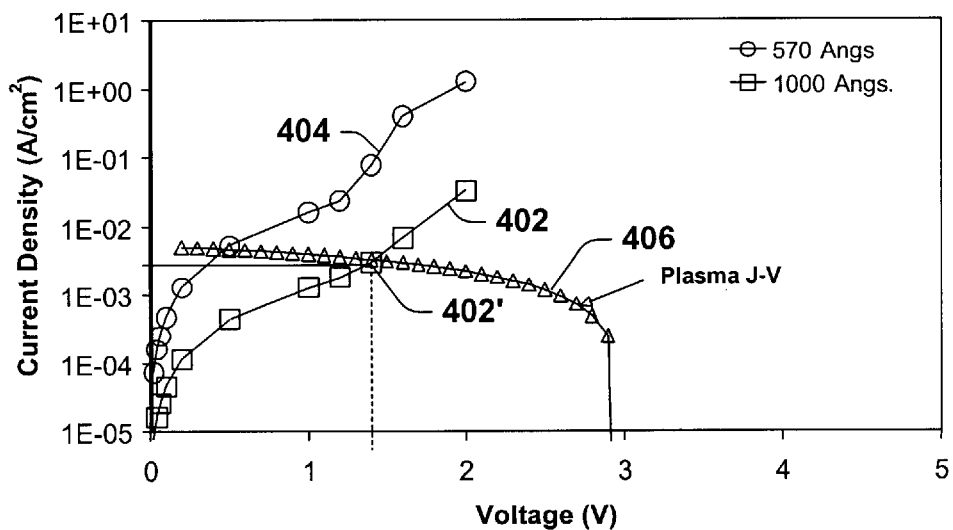
FIG. 9 is a graph illustrating current density versus voltage curves for ferroelectric capacitors having different thicknesses in the exemplary ferroelectric capacitor process charging monitor of FIGS. 3 and 4.
Figure 10:
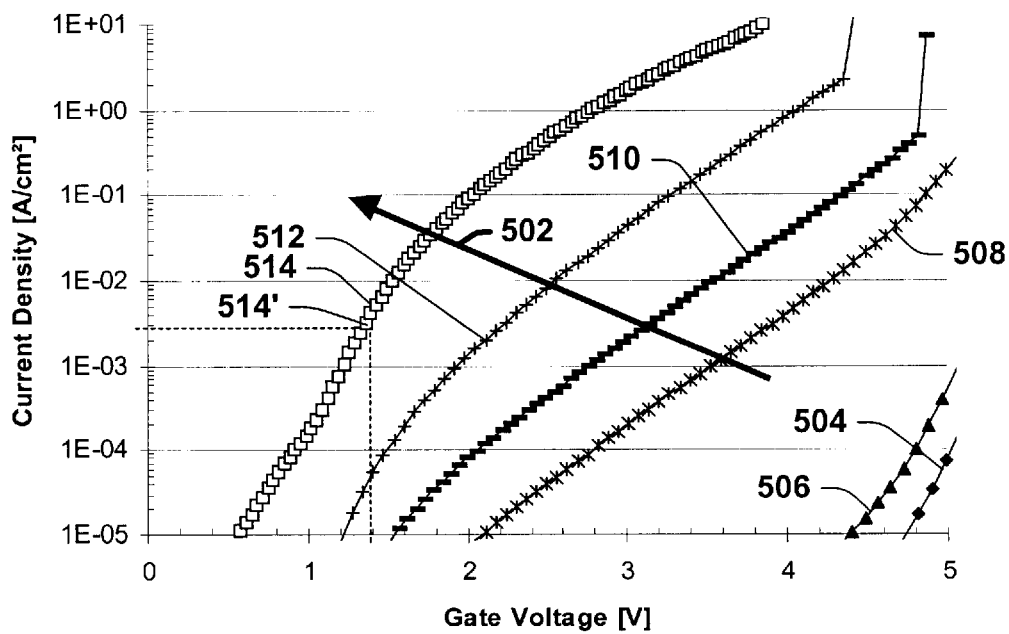
FIG. 10 is a graph illustrating current density versus voltage curves for MOS devices having different gate oxide thicknesses.

Referring also to FIGS. 8–10, the process related voltage value obtained at 38 may then be used at 40 to determine a process current density value. For example, a graph 400 in FIG. 9 illustrates ferroelectric capacitor leakage current density in $A/cm^2$ versus applied voltage curves 402 and 404 for two ferroelectric capacitors having ferroelectric material thickness of 1000 Å and 570 Å, respectively, together with a plasma J-V curve 406 for an exemplary processing step or series of steps. In the present example, it is assumed that the ferroelectric capacitor used in the flow 20 has a ferroelectric material thickness of 1000 Å, and that the process related voltage from 38 is about 1.3 volts.

In this example, the process voltage value determined at 38 is correlated to the curve 402, corresponding to the 1000 Å ferroelectric capacitor, to determine at 40 that the process current density experienced was about 3 E-3 $A/cm^2$. Knowing this value, and the correspondence between the test ferroelectric capacitor and one or more gate oxides in the wafer, a gate oxide process voltage may be determined at 42, according to a current density vs. voltage curve for the gate oxide, before the flow 20 ends at 44.

A graph 500 in FIG. 10 illustrates curves 504–514 of MOS device gate oxide current density in $A/cm^2$ versus gate voltage, wherein the curves 504–514 correspond to MOS device gate oxides of different thicknesses. The performance of the MOS devices is inversely proportional to the gate oxide thickness, wherein recent efforts to enhance device performance and reduce power consumption have driven gate oxide thicknesses downward to below 100 Angstroms. The trend line 502 in the graph 500 illustrates this trend towards ever thinner gate oxides, wherein the curves 504 through 514 correspond to MOS devices with decreasing gate oxide thickness.

The inventors have appreciated that as gate oxide thicknesses continue to decrease, the gate oxide current density for a given gate oxide thickness can be correlated with the polarization voltages experienced in a ferroelectric capacitor of a corresponding thickness. Thus, the present invention provides for sizing the ferroelectric charging detector material thickness (e.g., the thickness of the material 124 in the capacitor 110 in FIGS. 3 and 4 described below) to correspond to a gate thickness of one or more MOS devices in the wafer. In this manner, the polarization of the ferroelectric capacitor can be correlated with process related charging damage to the gate oxide material in the MOS devices. For example, in order to estimate process related current density in a MOS device having a gate oxide thickness corresponding to curve 514 in the graph 500 (FIG. 10), a correlation can be established between the curve 514 and curve 402 of graph 400 in FIG. 9. This allows determination of a point 402' on the plasma J-V curve 40 where the curve 406 was unknown prior to such testing.

Accordingly, the thickness of the ferroelectric material in the capacitor could be fabricated to about 1000 Å. In this example, application of about 1.3 volts across the gate oxide results in a gate oxide current density of about 3E-3 A/cm$^2$ at point 514' in the graph 500 (FIG. 10), and the same is true at point 402' in graph 400 (FIG. 9). For other gate oxide thicknesses, the ferroelectric material thickness could be adjusted accordingly through correlation of curves in plots such as graphs 400 and 500. It will be appreciated in this regard, that the correlations illustrated herein are exemplary in nature and that the provision of a ferroelectric sensor device having a thickness and/or material correlated to a gate oxide thickness in a wafer may be done according to any appropriate curves within the scope of the invention.

FIG. 8 illustrates a graph 300 of switched polarization charge density in uC/cm$^2$ versus voltage for two different ferroelectric capacitor devices having ferroelectric material thicknesses of about 700 and 900 Å, respectively. As can be seen from the graph 300, the charge densities (e.g., switched polarization in uC/cm$^2$) are less for the device having higher thickness (900 Å) than for the thinner device (700 Å). For example, the current density at point 302 for the 900 Å thick device (e.g., about 25 uC/cm$^2$) is significantly less than that of point 304 for the thinner 700 Å device (e.g., more than 40 uC/cm$^2$).

Thus, in this aspect of the invention, the provision of the ferroelectric capacitor comprises forming a ferroelectric material to a thickness corresponding to a thickness of a gate oxide in the wafer. In addition, the techniques of the invention comprise determining a process related gate oxide current density value according to the amount of process related ferroelectric capacitor polarization after the processing operation. Furthermore, a plurality of ferroelectric monitor devices may be provided within a single wafer, having different ferroelectric material thicknesses, by which correlation of process related charging damage may be had for MOS devices of different gate oxide thicknesses fabricated in the wafer.

In the above technique of FIG. 2, two voltage pulse are applied and corresponding current waveforms are measured in order to determine a process related charging value of interest. Other techniques may be employed in accordance with the invention, using one or more such test pulses. For example, a first test voltage may be applied, such as a voltage pulse, and a corresponding first current associated with the ferroelectric capacitor may be measured as described above. The measured current is then used to determine a corresponding first switching charge density value in uC/cm$^2$. As the processing at 8 (FIG. 1) may have polarized the ferroelectric capacitor to a certain value, the first switching current/switching charge density values at 26 and 28 are representative of the change in polarization due to the first test voltage application at 24.

Where the first test voltage is of known amplitude (e.g., 2 volts) and pulse width, and where the thickness of the ferroelectric capacitor is known, the process related charging may be determined directly from the first switching charge density value. For example, in the J-V graph 300 of FIG. 8 (e.g., charge density versus voltage), for a ferroelectric capacitor having ferroelectric material thickness of 90 nm (900 Å), the charge density at point 302 is about 25 uC/cm$^2$, corresponding to about 1 volt. For two volts applied to the same device at point 303, a switching charge density of about 50 uC/cM$^2$ is seen.

Thus, where the processing at 8 of FIG. 1 causes 1 volt to be applied to the 900 Å ferroelectric capacitor, the process related charge density of 25 uC/cm$^2$ results. Thereafter, application of a first test voltage at 24 of about 2 volts would cause the remaining charge density (e.g., 50 uC/cm$^2$-25 uC/cm$^2$=25 uC/cm$^2$) to be ascertained at 28 by integrating the measured current waveform from 26. From the J-V curve for the ferroelectric capacitor of known thickness and material, therefore, it can be determined that the process related charge density value is the difference between the total amount switched by the first test voltage for an unpolarized capacitor (e.g., 50 uC/cm$^2$) and the first switching charge density value obtained at 28. Also from FIG. 8, it can be seen that a process related voltage (X axis) can be determined once the process related charge density value (Y axis) is obtained at 28. In the above example, the process related voltage of about 1 volt can thus be easily obtained at point 302 once the process related charge density value of 25 uC/cm$^2$ has been determined. Thus, the invention provides for relatively fast determination of the process voltage without need for precharging or prepolarizing the ferroelectric device, and with a single test voltage application at 24.

Alternatively, where the curve 300 is not known for a particular ferroelectric capacitor, additional test voltage pulses may be employed to ascertain the process related charging values, for example, using a three pulse testing technique. The corresponding measured currents or charge density values obtained therefrom may be scaled to obtain process related charging values. For instance, this scaling may involve computing the difference between two such charge density values to obtain a process related charge density value, and a corresponding process related voltage. Thus, a second test voltage may be applied having a polarity opposite that of the first test voltage. A third test voltage is then applied, having the same polarity, pulse width, and amplitude as the first test voltage, and a corresponding third current is measured. From this, a third switching charge density value is determined.

In this example, the first charge density value represents the difference between the fully polarized switching charge density and the desired process related switching charge density. The second test pulse, being of opposite polarity to the first and third pulses, fully reverses the polarization of the ferroelectric capacitor. The third test voltage then fully polarizes the ferroelectric capacitor in the initial direction, wherein the third switching current density value represents the full polarization switching charge density. The first switching current density value may then be scaled by the third switching current density value, for example, by subtracting the first switching current density value from the third switching current density value, to determine the desired process related switching charge density. This scaled result is then used to derive the process related voltage which was experienced by the ferroelectric capacitor during the processing step(s) at 8.

Figure 3:
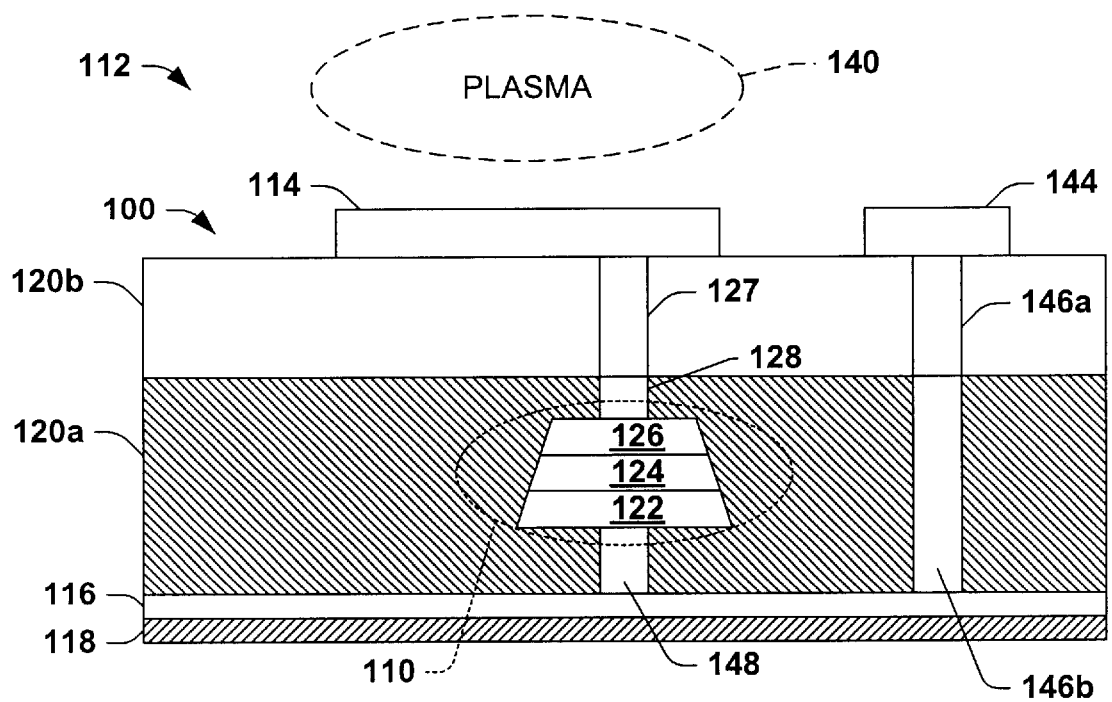
FIG. 3 is a partial side elevation view in section, illustrating an exemplary ferroelectric capacitor process charging monitor formed in a semiconductor wafer in accordance with the invention.
Figure 4:
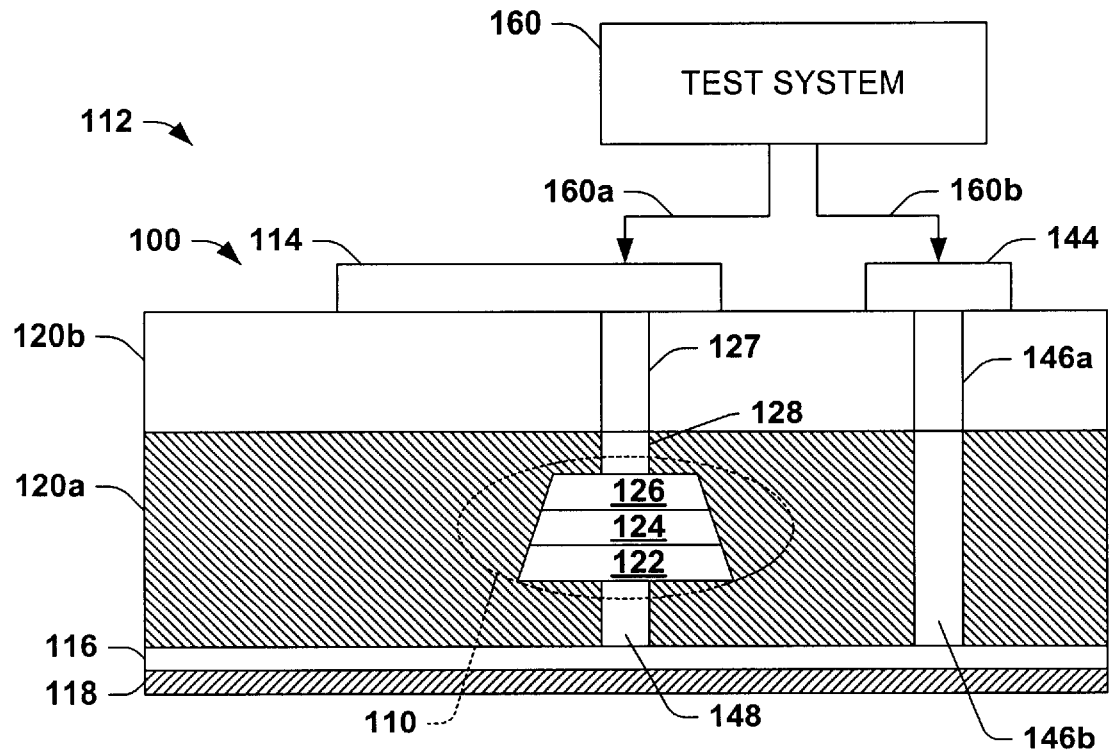
FIG. 4 is a partial side elevation view in section, illustrating an exemplary test system measuring polarization of the ferroelectric capacitor process charging monitor of FIG. 3 following processing in accordance with an aspect of the invention.

Referring now to FIGS. 3 and 4, an exemplary ferroelectric charging monitor or detector device 100 is illustrated, in association with which one or more aspects of the invention may be carried out. The device 100 is formed in a semiconductor wafer 112 for monitoring charging related to a plasma process 140 proximate the wafer 112 during fabrication or processing thereof. As noted above, however, the present invention provides methodologies for ascertaining or determining charging values associated with any type of processing operations, and is not limited to use in association with plasma type processes. The wafer 112, moreover, may be a production wafer or a dedicated test wafer used to evaluate process related charging associated with one or more semiconductor device manufacturing steps.

The device 100 comprises a ferroelectric capacitor 110 formed in the wafer 112, which has a bottom conductive electrode 122 overlying a substrate 118, a ferroelectric material 124 overlying the bottom electrode 122, and a top conductive electrode 126 overlying the ferroelectric material 124. The ferroelectric portion 124 of the FE capacitor 110 may comprise any suitable ferroelectric material, such as Pb(Zr,Ti)O3 (e.g., PZT), (Ba,Sr)TiO3 (e.g., BST), SrTiO3 (e.g., STO) and SrBi2Ta2O9 (e.g., SBT), BaTiO3 (BTO), (Bi1-xLax) 4Ti3O12 (BLT), or other ferroelectric material formed between the conductive electrodes 122 and 126 in the wafer 112. The material type, thickness, and/or area may be adjusted as desired to correspond to a particular gate oxide of interest in the device (not shown).

A conductive antenna 114 is formed, at least a portion of which is exposed to allow connection to external instruments and to collect process related charge during a processing operation. For example, the antenna 114 may collect charge caused by exposure of the wafer 112 to the plasma 140 and thereafter be connected to the exemplary test system 160 illustrated and described further hereinafter with respect to FIGS. 4 and 5. The top electrode 126 is connected to the antenna 114 via upper and lower vertical conductive portions 127 and 128. A conductive metal layer 116 overlies a substrate 118, and one or more layers 120a, 120b of insulator material (e.g., such as may be formed of silicon dioxide SiO2 or other ILD material) surround the capacitor 110 wherein the insulator layer 120a overlies the metal layer 116 in the wafer 112. External test equipment (e.g., such as the test system 160 of FIGS. 4 and 6) provides a load resistor for measurement of the post-processing polarization of the ferroelectric capacitor 110.

The thickness, material, and/or the area of the ferroelectric material 124 may be adjusted to tune the sensitivity of the device 100 to process related charging, for example, so as to correspond to a gate oxide of interest. In this manner, the methodologies of the invention may provide improved detection or indication of process related charging which could damage or adversely affect performance of MOS devices and other electrical components formed in the wafer 112. A conductive probe pad 144 is also formed in the wafer 112, which is electrically connected to the bottom conductive electrode 122 via a first vertically extending conductive plug 146 having upper and lower portions 146a and 146b, respectively, the metal layer 116, and a second conductive plug 148 extending between the metal layer 116 and the bottom electrode 122. As with the antenna 114, all or a portion of the probe pad 144 is exposed so as to allow connection to external instruments.

The structural components illustrated in FIGS. 3 and 4 may be formed in the wafer 112 using any appropriate fabrication steps, and are not necessarily drawn to scale. It will be appreciated by those of ordinary skill in the art, moreover, that the various methods in accordance with the present invention may be implemented in association with the exemplary device 100 illustrated and described herein, as well as with variations thereof and with other structures not shown.

Figure 5:
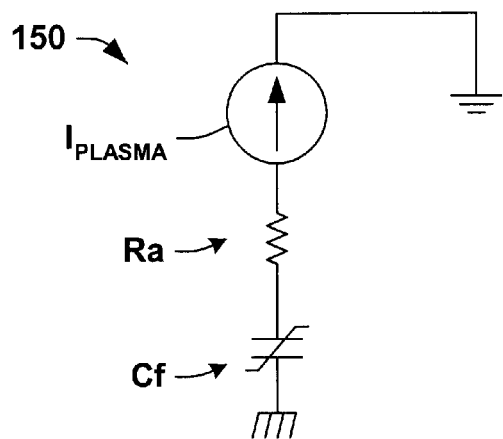
FIG. 5 is a schematic diagram illustrating a simplified circuit for the exemplary process charging monitor of FIGS. 3 and 4.

Referring also to FIG. 5, the capacitor 110 and the antenna 114 form a charging monitor circuit 150, wherein the resistance of the antenna 114 (Ra) is serially connected with the capacitor 110 (Cf) between the upper surface of the wafer 112 and the substrate 118. As the wafer 112 is processed using the plasma 140 (e.g., such as during etching, deposition, resist ashing, scrubbing, implantation, etc.), charged particles therefrom may accumulate on the upper wafer surface including the antenna 114, creating a voltage potential between antenna 114 and the substrate 118, which can be determined by the above described and other methods of the invention.

FIG. 5 schematically illustrates a simplified charging circuit 150 for the device 100 of FIGS. 3 and 4 during a plasma based processing operation causing charge accumulation on the wafer 112. Accumulated charge from the plasma 140 causes a current $I_{PLASMA}$ to flow between the upper surface of the wafer 112 and the substrate 118 in the monitor 100, which may be of positive or negative polarity, depending upon the particular plasma 140 employed in processing the wafer 112. The resistances of the antenna 114 is represented in the circuit 150 as Ra and the capacitance of the ferroelectric capacitor 110 is represented as Cf. Although the current source $I_{PLASMA}$ is illustrated in FIG. 5 as flowing out of the FE capacitor 110, the direction of plasma current flow within the components of the charging monitor 100 will vary for different processing operations according to the polarity of process related charge accumulating on the surface of the wafer 112.

Figure 6:
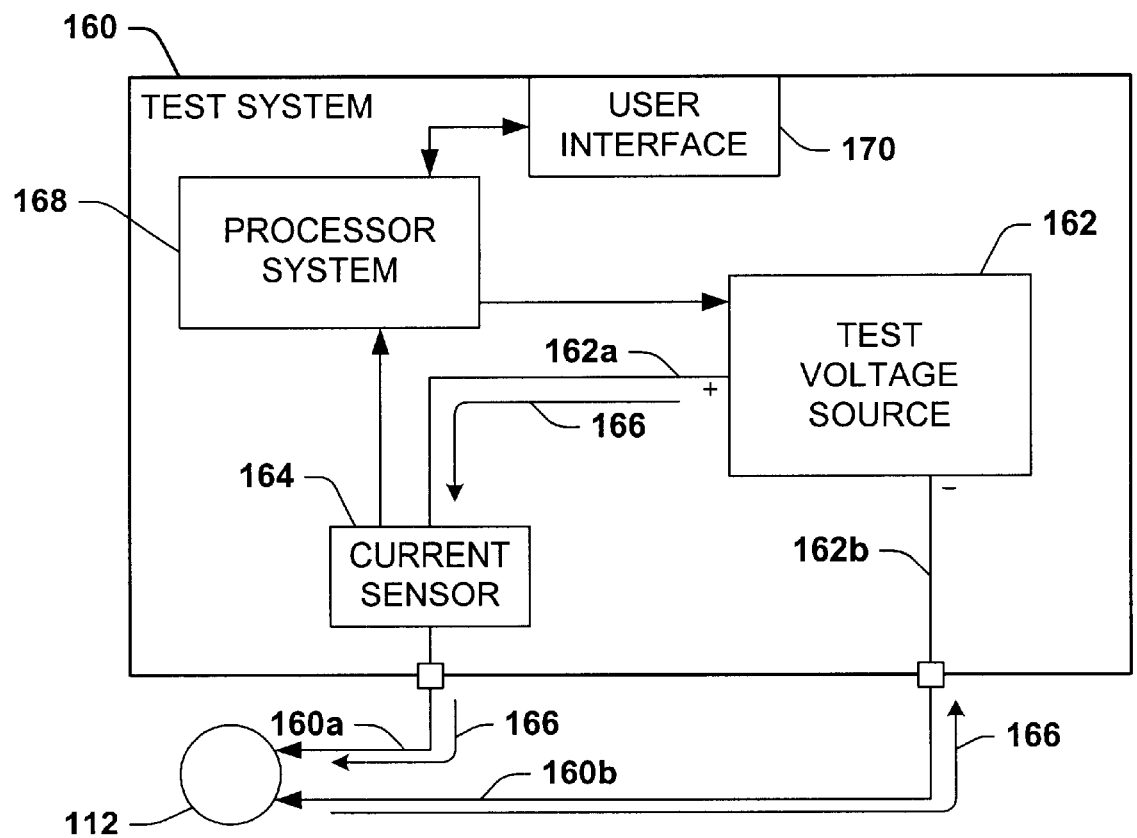
FIG. 6 is a simplified schematic diagram further illustrating the exemplary test system of FIG. 4.

Referring now to FIGS. 4 and 6, once the processing operation of interest has been completed, a test system 160 is connected to the antenna 114 and the probe pad 144 of the wafer 112 using leads 160a and 160b, respectively, to determine the post-processing polarization state of the ferroelectric capacitor 110. The illustrated test system 160 is exemplary in nature, and it will be appreciated that any appropriate test equipment may be employed in determining the extent to which the ferroelectric capacitor 110 has been polarized following the processing operation. The exemplary system 160 comprises a test voltage source 162 with positive and negative leads 162a and 162b, respectively, and a current sensor 164 (e.g., or a load resistor and a voltage sensor, not shown). The source 162 and the current sensor 164 are connected with the leads 160a and 160b to form a conductive path 166 through which test current flows when the source 162 applies one or more test voltages between the terminals 162a and 162b.

The voltage source 162 is operated under control of a processor system 168, which receives current readings or values from the current sensor 164. The processor system may be programmed or interfaced via a user interface 170, and may supply test results or other information to the interface 170. In one implementation of the invention, the system 160 is operated generally in accordance with the exemplary method 2 of FIG. 1, wherein the system 160 is employed to apply first and second test voltage pulses to the ferroelectric capacitor 110 (e.g., steps 24 and 30 in FIG. 2, pulses 201 and 202 in FIG. 7A) using the source 162. The system 160 also measures first and second current waveforms associated with the ferroelectric capacitor 110 (e.g., steps 26 and 32 in FIG. 2, waveforms 211 and 212 in FIG. 7A) using the current sensor 164 while the test voltages are applied. The current values are then stored in the processor system 168. The processor system 168 then performs the integrations, subtractions, scaling, correlations, etc. described above, in order to determine process related switching charge density values and/or corresponding process related voltage values in accordance with the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of monitoring process related charging of a wafer, comprising:
   providing a ferroelectric capacitor in the wafer, the ferroelectric capacitor having substantially no net polarization;
   performing a processing operation on the semiconductor wafer; and
   determining a process related polarization of the ferroelectric capacitor.

2. The method of claim 1, further comprising determining a process related charging value according to the process related polarization of the ferroelectric capacitor.

3. The method of claim 2, wherein determining the process related charging value comprises determining one of a voltage value, a current value, a current density value, a charge value, and a charge density value according to the process related polarization.

4. The method of claim 2, wherein determining the process related charging value comprises:
   applying a first test voltage to the ferroelectric capacitor after performing the processing operation;
   measuring a first current associated with the ferroelectric capacitor while the first test voltage is applied to the ferroelectric capacitor; and
   determining the process related charging value according to the first current.

5. The method of claim 4, wherein determining the process related charging value comprises determining a first switching charge density value according to the first current.

6. The method of claim 4, wherein determining the process related charging value further comprises:
   applying a second test voltage to the ferroelectric capacitor after applying the first test voltage;
   measuring a second current associated with the ferroelectric capacitor while the second test voltage is applied;
   determining first and second switching charge density values according to the first and second currents, respectively;
   scaling the first switching charge density by the second switching charge density; and
   determining the process related charging value according to the scaled first switching charge density.

7. The method of claim 6, wherein scaling the first switching charge density by the second switching charge density comprises subtracting one of the first and second switching charge densities from the other to determine the scaled first switching charge density.

8. The method of claim 7, wherein determining the process related charging value comprises:
   determining a process related voltage according to the scaled first switching charge density; and
   determining a process related current density according to the process related voltage.

9. The method of claim 8, wherein determining the process related charging value further comprises determining a gate oxide voltage according to the process related current density.

10. The method of claim 6, wherein determining the process related charging value comprises:
    determining a process related voltage according to the scaled first switching charge density; and
    determining a process related current density according to the process related voltage.

11. The method of claim 10, wherein determining the process related charging value further comprises determining a gate oxide voltage according to the process related current density.

12. The method of claim 11, wherein determining first and second switching charge density values comprises:
    integrating a first current waveform associated with the first current to determine the first switching charge density value; and
    integrating a second current waveform associated with the second current to determine the second switching charge density value.

13. The method of claim 6, wherein determining first and second switching charge density values comprises:
    integrating a first current waveform associated with the first current to determine the first switching charge density value; and
    integrating a second current waveform associated with the second current to determine the second switching charge density value.

14. The method of claim 4, wherein determining the process related charging value further comprises:
    applying a second test voltage to the ferroelectric capacitor after applying the first test voltage, wherein the first and second test voltages are of opposite polarity;
    measuring a second current associated with the ferroelectric capacitor while the second test voltage is applied;
    determining first and second switching charge density values according to the first and second currents, respectively;
    scaling the first switching charge density by the second switching charge density; and
    determining the process related charging value according to the scaled first switching charge density.

15. The method of claim 14, wherein determining the process related charging value further comprises:
    applying a third test voltage to the ferroelectric capacitor after applying the second test voltage, wherein the first and third test voltages are of the same polarity;
    measuring a third current associated with the ferroelectric capacitor while the third test voltage is applied;
    determining first and third switching charge density values according to the first and third currents, respectively;
    scaling the first switching charge density by the third switching charge density; and determining the process related charging value according to the scaled first switching charge density.

16. The method of claim 4, wherein determining the process related charging value further comprises:
applying a second test voltage to the ferroelectric capacitor after applying the first test voltage, wherein the first and second test voltages are of opposite polarity;
applying a third test voltage to the ferroelectric capacitor after applying the second test voltage, wherein the first and third test voltages are of the same polarity;
measuring a third current associated with the ferroelectric capacitor while the third test voltage is applied;
determining first and third switching charge density values according to the first and third currents, respectively;
scaling the first switching charge density by the third switching charge density; and
determining the process related charging value according to the scaled first switching charge density.

17. The method of claim 1, wherein determining the process related polarization comprises:
applying a first test voltage to the ferroelectric capacitor after performing the processing operation;
measuring a first current associated with the ferroelectric capacitor while the first test voltage is applied to the ferroelectric capacitor; and
determining a first switching charge density value according to the first current.

18. The method of claim 17, wherein determining the process related polarization further comprises:
applying a second test voltage to the ferroelectric capacitor after applying the first test voltage, wherein the first and second test voltages are of opposite polarity;
applying a third test voltage to the ferroelectric capacitor after applying the second test voltage, wherein the first and third test voltages are of the same polarity;
measuring a third current associated with the ferroelectric capacitor while the third test voltage is applied;
determining first and third switching charge, density values according to the first and third currents, respectively;
scaling the first switching charge density by the third switching charge density; and
determining a process related charging value according to the scaled first switching charge density.

19. The method of claim 18, wherein determining the process related charging value comprises determining a process related voltage according to the scaled first switching charge density.

20. The method of claim 17, further comprising determining a process related voltage according to the first switching charge density.

21. The method of claim 17, further comprising determining a process related voltage according to the first switching charge density, a J-V curve for the ferroelectric capacitor, and an area of the ferroelectric capacitor.

22. A method of determining a voltage associated with a semiconductor processing step, the method comprising:
providing a ferroelectric capacitor in a wafer, the ferroelectric capacitor having substantially no net polarization;
performing the processing step on the semiconductor wafer;
determining a process related polarization of the ferroelectric capacitor; and
determining a voltage associated with the processing step according to the process related polarization.

23. The method of claim 22, wherein determining the process related polarization comprises:
applying a first test voltage to the ferroelectric capacitor after performing the processing step;
measuring a first current associated with the ferroelectric capacitor while applying the first test voltage;
determining a first switching charge density value according to the first current; and
determining the voltage associated with the processing step according to the first switching charge density value.

24. The method of claim 23, wherein determining the process related polarization further comprises:
applying a second test voltage to the ferroelectric capacitor after applying the first test voltage, wherein the first and second test voltages are of opposite polarity;
applying a third test voltage to the ferroelectric capacitor after applying the second test voltage, wherein the first and third test voltages are of the same polarity;
measuring a third current associated with the ferroelectric capacitor while the third test voltage is applied;
determining a third switching charge density value according to the third current;
scaling the first switching charge density by the third switching charge density; and
determining the voltage associated with the processing step according to the scaled first switching charge density value.

25. The method of claim 24, further comprising determining the voltage associated with the processing step according to the scaled first switching charge density value, a J-V curve for the ferroelectric capacitor, and an area of the ferroelectric capacitor.

26. The method of claim 23, further comprising determining the voltage associated with the processing step according to the first switching charge density value, a J-V curve for the ferroelectric capacitor, and an area of the ferroelectric capacitor.

27. A method of monitoring process charging in a semiconductor manufacturing process, comprising:
providing a ferroelectric capacitor in a wafer;
processing the semiconductor wafer according to the manufacturing process; and
determining a charging value associated with the manufacturing process according to a post-processing polarization of the ferroelectric capacitor.

28. The method of claim 27, wherein determining the charging value comprises:
determining a switching charge density value associated with the ferroelectric capacitor; and
determining a voltage associated with the manufacturing process according to the switching charge density value, an area of the ferroelectric capacitor, and a J-V curve for the ferroelectric capacitor.

29. The method of claim 28, wherein determining the switching charge density value comprises:
applying a first test voltage to the ferroelectric capacitor after processing the semiconductor wafer;
measuring a first current associated with the ferroelectric capacitor while applying the first test voltage;
determining a first switching charge density value according to the first current; and
determining the voltage associated with the manufacturing process according to the first switching charge density value, the area of the ferroelectric capacitor, and the J-V curve for the ferroelectric capacitor.

30. The method of claim 29, wherein determining the switching charge density value further comprises:

applying a second test voltage to the ferroelectric capacitor after applying the first test voltage, wherein the first and second test voltages are of opposite polarity;

applying a third test voltage to the ferroelectric capacitor after applying the second test voltage, wherein the first and third test voltages are of the same polarity;

measuring a third current associated with the ferroelectric capacitor while the third test voltage is applied;

determining a third switching charge density value according to the third current;

scaling the first switching charge density value by the third switching charge density value; and determining the voltage associated with the manufacturing process according to the scaled first switching charge density value, the area of the ferroelectric capacitor, and the J-V curve for the ferroelectric capacitor.

* * * * *